United States Patent [19]

Daniel

[11] Patent Number: 5,037,767
[45] Date of Patent: Aug. 6, 1991

[54] METHOD OF MANUFACTURING A SEMICONDUCTOR DEVICE BY ION IMPLANTATION THROUGH AN ION-SENSITIVE RESIST

[75] Inventor: Peter J. Daniel, Dorking, England

[73] Assignee: U.S. Philips Corporation, New York, N.Y.

[21] Appl. No.: 415,398

[22] Filed: Sep. 29, 1989

Related U.S. Application Data

[63] Continuation of Ser. No. 835,510, Mar. 3, 1986, abandoned.

[30] Foreign Application Priority Data

Mar. 13, 1985 [GB] United Kingdom ............... 8506489

[51] Int. Cl.⁵ ................. H01L 21/265; H01L 21/00
[52] U.S. Cl. ............................... 437/28; 437/229;
  437/928; 156/628; 156/659.1
[58] Field of Search ............... 437/28, 229, 928;
  156/625, 628, 659.1

[56] References Cited

U.S. PATENT DOCUMENTS

| | | | |
|---|---|---|---|
| 3,950,188 | 4/1976 | Bower | 437/28 |
| 4,347,654 | 9/1982 | Allen et al. | 156/628 |
| 4,398,964 | 8/1983 | Malwah | 437/229 |
| 4,514,233 | 4/1985 | Kawabuchi | 437/229 |
| 4,514,251 | 4/1985 | van Ommen et al. | 156/628 |
| 4,546,534 | 10/1985 | Nicholas | 437/229 |
| 4,566,937 | 1/1986 | Pitts | 156/628 |
| 4,601,778 | 7/1986 | Robb | 156/628 |
| 4,748,103 | 5/1988 | Hollinger | 437/28 |
| 4,833,097 | 5/1987 | Butler et al. | 437/28 |
| 4,904,615 | 2/1990 | Okuyama et al. | 437/28 |

FOREIGN PATENT DOCUMENTS

| | | | |
|---|---|---|---|
| 58-131 | 1/1983 | Japan | 156/628 |
| 59-119728 | 7/1984 | Japan | 156/628 |
| 1355806 | 6/1974 | United Kingdom . | |
| 2024504 | 1/1980 | United Kingdom . | |

OTHER PUBLICATIONS

Jensen, J., "Ion Beam Resists", Solid State Tech., Jun. 1987, 145–150.
McKenna et al., "Alignment Tech. for Ion Beam Writ.", IBM Tech. Dis. Bulletin, vol. 25, #5, 10/82.
Kubena et al., "Si MOSFET Fabrication Using Focused Ion Beams", IEEE Transactions, vol.-ED-31, No. 9, Sep. 1984, pp. 1186–1189.

Primary Examiner—David Simmons
Assistant Examiner—Lori-Ann Johnson
Attorney, Agent, or Firm—Paul R. Miller

[57] ABSTRACT

In the manufacture of a semiconductor device, e.g. a bipolar or MOS transistor, a narrow beam (4) of ions is deflected across a major surface of a semiconductor device body (1,2) to implant ions, e.g. a boron, into a region (3) of the body. In accordance with the invention a resist mask (5a) is obtained autoregistered with the implanted region (3) by effecting the implantation through a layer (5) of ion-sensitive resist thus exposed by the ion beam (4) in the area (5a) overlying the implanted region (3) at the same time as the implantation occurs into the body region (3). The non-exposed area of the layer (3) is afterwards removed by developing the resist, and the ion-exposed area (5a) is then used as a mask during a subsequent processing step, e.g. an etching or doping step, in the device manufacture. The implanted region (3) may be, e.g., a peripheral base region portion of a bipolar transistor or a parasitic-channel stopper below a field insulating layer (2) of an MOS integrated circuit.

8 Claims, 2 Drawing Sheets

METHOD OF MANUFACTURING A SEMICONDUCTOR DEVICE BY ION IMPLANTATION THROUGH AN ION-SENSITIVE RESIST

This is a continuation of application Ser. No. 835,510, filed Mar. 3, 1986 now abandoned.

This invention relates to methods of manufacturing a semiconductor device using a beam of ions, particularly but not exclusively for the manufacture of bipolar transistors and insulated-gate field-effect transistors, for example in integrated circuits.

BACKGROUND OF THE INVENTION

In the article entitled "Si MOSFET Fabrication Using Focussed Ion Beams" by R. L. Kubena et al I.E.E.E. Transactions on Electron Devices, Vol. ED-31, No. 9, September 1984, pages 1186 to 1189, there is described one specific example of a method of manufacturing a semiconductor device in which ions are implanted into a region of a semiconductor device body by deflecting in a pattern across a major surface of the body a beam of ions which are of sufficient energy to be implanted in the body. In the particular example described, source, drain and channel regions of a p channel depletion mode field-effect transistor (FET) are formed in an n type silicon body by implantation of boron ions from a source of boron and platinum with the platinum ions present in the beam being stopped by a trapping layer of aluminium at the body surface.

This I.E.E.E. Transactions article also describes the quite separate use of a beam of silicon ions from a gold-silicon liquid-metal-alloy source for ion-beam lithography to expose a layer of ion-sensitive resist in an area where a gate of an n channel enhancement mode field-effect transistor (FET) is to be formed from an underlying molybdenum or polycrystalline silicon layer on a thin silicon dioxide layer at a major surface of the device body. The non-exposed area of the layer of resist is removed by developing, and the exposure pattern is transferred into the underlying molybdenum or polycrystalline silicon layer by plasma or reactive ion etching so as to form a metal-on-oxide-on-semiconductor (MOS) insulated gate of the FET.

SUMMARY OF THE INVENTION

According to the present invention a method of manufacturing a semiconductor device, in which ions are implanted into a region of a semiconductor device body by deflecting in a pattern across a major surface of the body a beam of ions which are of sufficient energy to be implanted in the body, is characterised in that the implantation into the region is effected through a layer of ion-sensitive resist provided on the major surface of the body. The layer is exposed by the ion beam in the area overlying the region of the body at the same time as the implantation occurs into the region, after which the non-exposed area of the layer is removed by developing the resist. The ion-exposed area of the resist layer is then used as a mask during a subsequent processing step in the manufacture of the device.

The present invention is based on the recognition that it can be advantageous in semiconductor device manufacture to define a mask pattern of resist using the same processing step as is used to define the same pattern for an implanted region underlying the mask pattern and that this can be achieved in a particularly simple manner, by using an ion beam to expose an area of ion-sensitive resist at the same time as at least some of the ions are implanted into the desired region through the layer of resist. In this manner the pattern of the underlying implanted region is automatically aligned with and corresponds to the pattern of the mask formed from the ion-sensitive resist.

DISCUSSION OF THE PRIOR ART

It should be noted that the automatic alignment obtained using an ion-beam in this manner in accordance with the invention results directly in the same pattern for the implanted region and for the resist area which is to be used as a mask during a subsequent processing step in the device manufacture. Conventional processes for achieving automatic alignment normally result directly in a pattern which is the inverse (i.e. of complementary shape) to that of a resist area defined not using ion-beam lithography. Specific examples of two such conventional processes are given in United Kingdom patent applications (GB-A) 1355806 and 2024504, in which metal layer patterns are formed with complementary shape to photoresist patterns. In each case additional automatic alignment steps are necessary to obtain an implanted region having the same pattern as a mask which is to be used subsequently in the device manufacture. Thus, in GB-A 1355806 the implanted region is formed with a complementary shape to the metal layer pattern by dopant implantation around the metal layer pattern, and in GB-A 2024504 an implanted region is formed by implantation around the photoresist area so as to have a complementary shape to the photoresist area and therefore the same shape as the metal layer pattern which is to be used subseqently as a mask in the device manufacture. Therefore, compared with these known processes, a significant reduction in the number of processing steps necessary to provide an implanted region and a mask having the same pattern can be achieved in accordance with the present invention.

FURTHER SUMMARY OF THE INVENTION

The ion-exposed area of the resist layer may be used as a mask for localising various treatments, e.g. etching or/and doping, during subsequent processing steps. The beam may comprise ions of a dopant characteristic of one conductivity type which are implanted to form a region of the one conductivity type, and the ion-exposed area of the resist layer may be used as a mask to define (either directly or indirectly) at least partly the lateral extent of a region of the opposite conductivity type which is formed in a part of the body beside the region of the one conductivity types. Such regions of both the one and opposite conductivity type may be employed in different forms in various devices. Thus, for example, the region of the opposite conductivity type may be a source or drain region of a field-effect transistor, and the implanted region of the one conductivity type may be sufficiently highly doped to prevent the occurrence of a parasitic channel of the opposite conductivity type below an insulating layer around the active regions of the transistor. In another form the device may comprise a bipolar transistor having an emitter region provided by, for example, the region of the opposite conductivity type, and the implanted region of the one conductivity type may form a highly doped portion of a base region which laterally surrounds the emitter region.

BRIEF DESCRIPTION OF THE DRAWINGS

These and other features in accordance with the invention will be illustrated more specifically in embodiments of the invention now to be described, by way of example, with reference to the accompanying diagrammatic drawings, in which.

Figure 1:
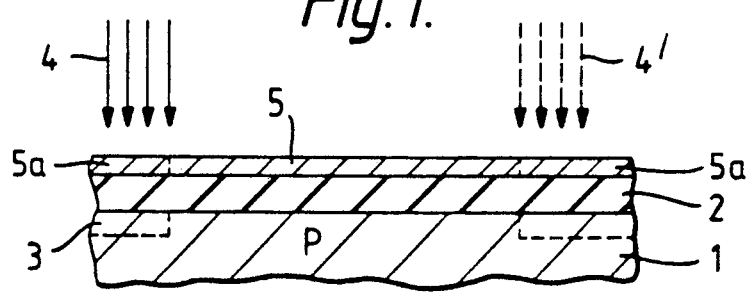
FIG. 1 is a cross-sectional view of part of a semiconductor device body at one stage in the manufacture of a semiconductor device by a method in accordance with the invention.

It should be noted that all of the Figures are diagrammatic and not drawn to scale. The relative dimensions and proportions of parts of these Figures (particularly some of the thicknesses) have been shown exaggerated or diminished for the sake of clarity and convenience in the drawings. The same reference signs as used in one embodiment are generally used when referring to corresponding or similar parts in other embodiments.

DESCRIPTION OF THE INVENTION

The semiconductor device body illustrated at an early stage of manufacture in FIG. 1 comprises a main body portion 1 of semiconductor material (for example p type monocrystalline silicon) having an insulating layer 2 (for example of thermally-grown silicon dioxide) at its upper major surface. Ions are implanted into a region 3 (shown in broken outline in FIG. 1) by deflecting a narrow focussed ion beam 4 across the upper major surface. In the situation illustrated in FIG. 1, at least some of the ions of the beam 4 are of sufficient energy to be implanted in the semiconductor body portion 1 after penetrating the insulating layer 2 and an overlying layer 5. The pattern of the region 3 into which the ions are implanted is written in the body by controlling the movement of the narrow beam 4 across the upper major surface. When it is desired to form implanted regions which are not connected with each other in the implantation pattern, a shutter may be used or the beam may be widely deflected adjacent its source in known manner to prevent the beam 4 from reaching the device body. The beam 4 may consist of ions of a single chemical species or two or more chemical species, depending on the particular ion source used for the beam.

As will be evident from the subsequent Figures, the beam 4 in FIG. 1 is deflected in an annular or grid-like pattern to form an annular or grid-like implanted region 3 in the semiconductor body portion 1. The dotted arrows 4' in FIG. 1 illustrate the beam 4 after it has been deflected around from the left-hand side of FIG. 1 to the right-hand side. Depending on the device to be manufactured, the implanted ions of the beam 4 may be dopant atoms characteristic of one conductivity type (either n type or p type) in the semiconductor body portion 1 or may be atoms with different characteristics (for example, forming carrier-recombination centers in the semiconductor material). The implanted region 3 may be annealed in known manner during or/and after the implantation.

Figure 2:
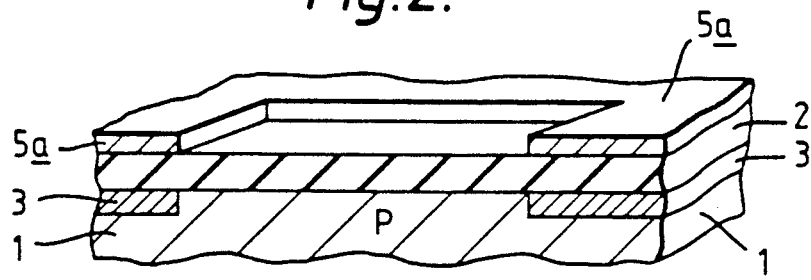
FIG. 2 is a partly cross-sectional and partly perspective view of the body part of FIG. 1 at a subsequent stage in the manufacture.

In accordance with the present invention the implantation into the region 3 is effected through a layer 5 of ion-sensitive resist provided on the upper major surface of the device body. Therefore, at the same time that the implantation occurs into the region 3, the layer 5 is exposed by the ion beam 4 in the area overlying the region 3. This ion-exposed area of the layer 5 is designated by the reference 5a in FIG. 1 and has a pattern corresponding to that of the region 3. When the beam 4 consists of more than one chemical species, the exposure and implantation may be carried out under such conditions that one species of the ions is implanted in the body portion 1 while another species which has a different mass and range is stopped in the resist layer 5 (or possibly the insulating layer 2) depending on its thickness. The non-exposed area of the layer 5 is subsequently removed by developing in known manner in a developing solution which dissolves the non-exposed area at least more rapidly than the ion-exposed area 5a. The resulting structure having a window in the resist layer 5 is illustrated in FIG. 2. The remaining ion-exposed area 5a of the resist layer 5 is then used as a mask during a subsequent processing step in the manufacture of the device.

Figure 3:
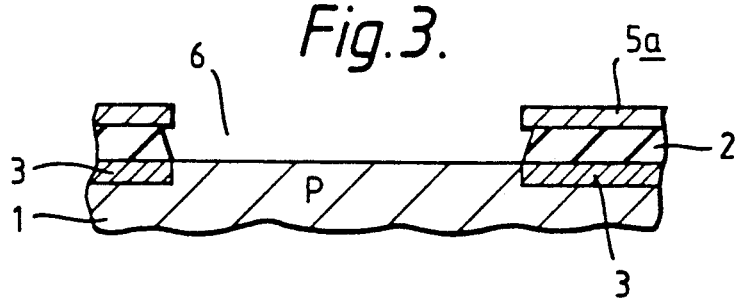
FIG. 3 is a cross-sectional view of the body part of FIG. 2 at a next stage in the manufacture.

FIG. 3 illustrates the use of the resist area 5a as an etchant mask to localise removal of the insulating layer 2 during an etching step to form a window 6 in the layer 2 at the semiconductor device body surface. The layer 2 is removed in this manner from an area not overlying the implanted region 3. After this etching step the resist area 5a may be dissolved away before effecting subsequent processing steps, or it may be retained for a further processing step. Thus, for example, dopant may be introduced into the body portion 1 through the window 6 in the insulating layer 2 either after or before the resist area 5a is removed. In both cases, the resist area 5a serves as a mask to define at least partly the lateral extent of this further dopant introduction. When this further dopant introduction is effected after removing the resist area 5a, the dopant introduction is masked solely by the insulating layer 2 which has a pattern defined by the resist area 5a. When it is effected before removing the resist area 5a, the resist area 5a may be adequate to act entirely as the dopant mask or may act as the mask in combination with the underlying layer 2. In some device manufacturing processes, the resist area 5a may even be used as a dopant mask before or instead of its use as an etchant mask.

All these various possible combinations of processing steps permit the invention to be used in the manufacture of a wide variety of semiconductor devices and are particularly useful for forming a dopant-implanted region 3 of one conductivity type in the body portion 1 and a further region (e.g. 10, 11 or 24) which has the opposite conductivity type in a part of the body portion 1 beside the region 3. Two quite different forms will now be illustrated with reference to FIGS. 4 and 5 (in which the further regions of opposite conductivity type are source and drain regions 10 and 11 of field-effect transistors) and with reference to FIGS. 6 and 7 (in which the further region of opposite conductivity type is an emitter region 24 of a bipolar transistor).

Figure 4:
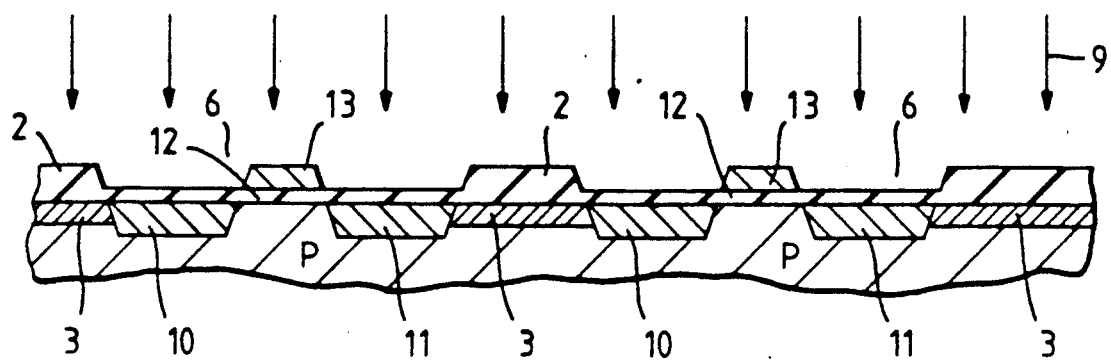
FIG. 4 is a cross-sectional view of part of a semiconductor device body of an integrated circuit at a stage in its manufacture subsequent to the stage illustrated in FIG. 3.
Figure 5:
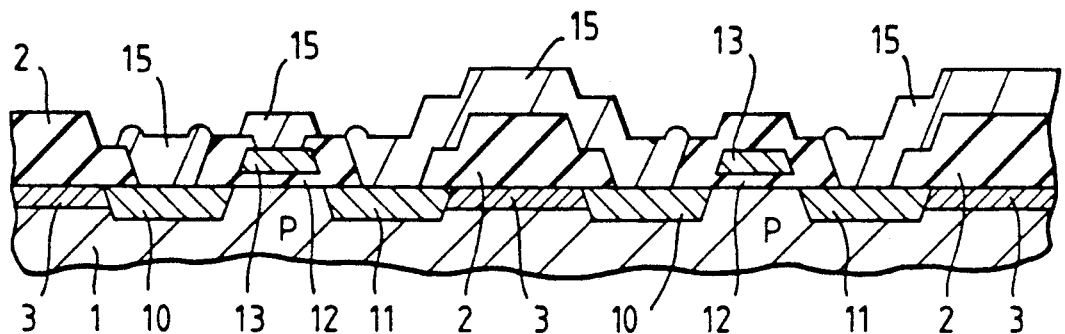
FIG. 5 is a cross-sectional view of the body part of FIG. 4 showing MOS transistors formed in this integrated circuit.

In the manufacturing process leading to the fabrication of the MOS integrated circuit of FIG. 5, the ion beam 4 may comprise boron ions which are implanted to form a more highly doped p type grid pattern 3 in a p type body portion 1. The ion-exposed grid-shaped area 5a of the layer 5 is used as an etchant mask to define in a thick (so-called "field") insulating layer 2 a plurality of windows 6 at each of which an insulated-gate field-effect transistor (10 to 12) is formed. Two such windows 6 are illustrated in FIGS. 4 and 5. The resist area 5a may be removed before forming any of the parts 10 to 12 of these transistors.

Thus, after removing the resist area 5a, a thin insulating layer may be provided at the semiconductor surface exposed in the windows 6, and a stripe 13 of material for forming the gate of the transistor is then provided locally on the thin insulating layer 12 across each window 6 so as to divide the window 6 into two separate areas where the separate source and drain regions 10 and 11 are to be formed. Opposite conductivity type determining dopant (for example arsenic) is then introduced into the p type body portion 1 at the windows 6 to form n type source and drain regions 10 and 11 which are located beside the p type grid region 3. The lateral extent of these source and drain regions 10 and 11 is defined directly by the window pattern of the insulating layer 2 (and therefore indirectly by the ion-exposed resist area 5a) and by the insulated gate stripe 13. This dopant introduction may be effected by flooding the upper major surface of the device body with a wide beam 9 of arsenic ions, as illustrated in FIG. 4.

The parts 10 to 12 of the transistors may be provided in known manner. Thus, for example, the gate insulating layer 12 may be of silicon dioxide thermally grown at the silicon surface in the windows 6. The gate stripe 13 may comprise (either separately or in combination) metal or metal silicide or polycrystalline silicon doped either before or during the formation of the source and drain regions 10 and 11. The source and drain regions may be formed by implantation through the areas of the insulating layer 12 not masked by the gate stripe 13 (as illustrated in FIG. 4), or these areas of the insulating layer 12 may be removed before forming the source and drain regions by implantation or diffusion.

A further insulating layer may then be deposited, after which contact windows are opened in the insulating layer structure for contacting the gates 13 and source and drain regions 10 and 11. A metallization pattern 15 is then provided to contact the gates 13 and source and drain regions 10 and 11 and to interconnect the transistors in a desired circuit configuration. In this integrated circuit the grid region 3, with which the overlying field insulating layer pattern 2 has been automatically aligned, is sufficiently highly doped to prevent the occurrence of parasitic channels (of the same conductivity type as the source and drain regions 10 and 11) below the parts of the insulating layer 2 between the windows 6 at which the transistors 10 to 13 are located. The conductive channel of each transistor is formed in the normal manner below its insulated gate 13 between its source and drain zones 10 and 11.

Figure 6:
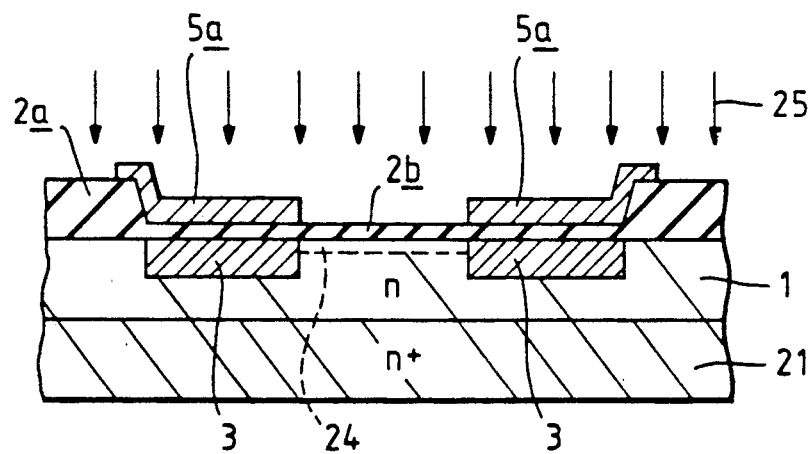
FIG. 6 is a cross-sectional view of part of a semiconductor device body of an n-p-n bipolar transistor at a stage in its manufacture subsequent to the stage illustrated in FIG. 2 or FIG. 3.
Figure 7:
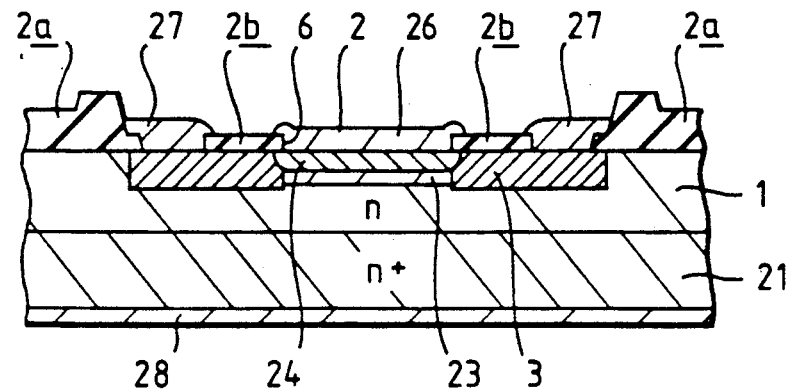
FIG. 7 is a cross-sectional view of the body part of FIG. 6 after subsequent processing to form the bipolar transistor.

In the manufacturing process leading to the fabrication of the n-p-n bipolar transistor of FIG. 7, the ion beam 4 may again comprise boron ions which are implanted to form a highly doped p type annular portion of the transistor base region in an n type body portion 1. In this example the body portion 1 may be an n type silicon epitaxial layer 1 on a more highly doped n type substrate 21. Also in this example, the resist layer 5 which is exposed by means of the beam 4 during the implantation may be present on an insulating layer 2 which in the form shown in FIG. 6 has parts 2a and 2b of different thicknesses and a stepped upper major surface. The insulating layer 2 is thinner (part 2b) at an area where the base and emitter regions of the transistor are to be formed. The beam 4 is deflected in an annular pattern to form an annular ion-exposed resist area 5a over an annular implanted region 3. In this particular example, as illustrated in FIG. 6, the inner periphery of the implanted region 3 is defined by the ion beam 4 and so is aligned with the inner periphery of the resist area 5a, whereas the outer periphery of the region 3 is defined by the inner periphery of the thick part 2a of the insulating layer 2; The ion-exposed resist area 5a overlaps this thick part 2a.

FIG. 6 illustrates a processing step after the resist layer 5 has been developed to form the resist mask 5a. In this step, at least the resist area 5a and the thick insulating layer part 2a are used as a mask while introducing both p and n type dopants into the area of the body portion 1 laterally surrounded by the p type region 3 so as to form an active base region 23 and an emitter region 24 of the transistor. If so desired the area of the thin insulating layer part 2b not covered by the resist area 5a may be removed (by etching using the resist area 5a as an etchant mask) before effecting these dopant introductions.

In FIG. 6 the entire upper major surface of the device body is flooded with a wide beam 25 of n type dopant ions (e.g. arsenic) to provide the emitter region 24 at the window in the resist area 5a. The active base region 23 may be provided in a similar manner using a wide beam of boron ions, either before or after the arsenic implantation. The implanted structure may be heated subsequently to anneal the implants and to diffuse slightly the implanted dopants in the body portion 1 to obtain optimum doping profiles for the regions 3, 23 and 24. However, if desired, the regions 23 and 24 may be formed entirely by dopant diffusion (without using implantation) into the body portion 1 after removing the area of the thin insulating layer part 2b not covered by the resist area 5a.

An emitter contact window 6 may be formed by etching away the area of the thin insulating layer part 2b not covered by the resist area 5a while using the resist area 5a as an etchant mask. Base contact windows are also opened by etching away an area of the thin insulating layer part 2b adjacent the thick insulating layer part 2a. Subsequently an emitter and base metallization pattern 26,27 is provided at the upper major surface, and the bottom surface of the substrate 21 may be metallised to form a collector electrode 28. In this device, the region 3 forms a base contact region which laterally surrounds the opposite conductivity type emitter region 24 formed at the window in the resist area 5a.

It will be evident that many other modifications are possible within the scope of the invention. In the embodiments illustrated in FIGS. 1 to 7 the beam 4 is deflected in an annular or grid-like pattern so as to define a non-exposed window area bounded by the ion-exposed resist area 5a and to form an ion-implanted region 3 which laterally surrounds a non-implanted area of the body portion 1. However, the invention may be used to form discrete ion-exposed resist areas 5a which are bounded by grid-like or annular non-exposed areas and below which discrete implanted regions 3 are formed laterally surrounded by grid-like or annular non-implanted areas of the body portion. Furthermore the implanted regions 3 may be formed in a layer, for example a silicon layer, at the device body surface instead of in the underlying semiconductor body portion 1. Thus, a wide variety of different device structures and patterns may be formed for the implanted regions 3 and resist areas 5a.

In the embodiments illustrated in FIGS. 1 to 7, the ion-exposed resist areas 5a are used subsequently as etchant and/or dopant masks. However, the resist areas 5a may also be used as masks in quite different processing steps. Thus, for example, a metal layer may be deposited over the resist area 5a and over the remainder of the device body surface not covered by the resist area 5a, after which the resist area 5a may be removed to lift off the part of the metal layer on the area 5a and to leave the remaining part of the metal layer on the device body surface. This remaining part of the metal layer may provide an electrode pattern in the semiconductor device and/or it may itself be used as a mask in a subsequent processing step.

In this way, for example, the gates 13 may be formed after the source and drain regions 10 and 11 in the manufacture of the field-effect transistors of FIGS. 4 and 5. Thus, instead of the wide beam 9, a focussed narrow beam, comprising arsenic ions may be deflected to form the source and drain regions 10 and 11 by implantation while at the same time exposing an ion-sensitive resist layer on the body surface. The area of the resist overlying the (non-implanted) channel area between the regions 10 and 11 is not exposed by this beam. After developing the resist pattern, a conductive layer may be deposited over the upper surface including the remaining ion-exposed areas of the resist which are then subsequently removed to lift off the overlying parts of the conductive layer and to leave remaining parts which provide the gates 13.

I claim:

1. A method of manufacturing a semiconductor device consisting essentially of the steps of
   (a) providing a semiconductor body,
   (b) providing an ion sensitive resist layer on a major surface of said semiconductor body,
   (c) implanting a beam of ions into a region of said semiconductor body through said layer of ion sensitive resist, said step of implanting being carried out by deflecting said beam across said major surface of said semiconductor body in a pattern corresponding to a deflection pattern, said beam of ions being of sufficient energy to be implanted into said semiconductor body in said pattern corresponding to said deflection pattern,
   wherein said implanting step further exposes at least a portion of said layer to said beam of ions at an area overlying said region simultaneously with said step of implanting into said region to thereby sensitize said portion of said layer in said pattern corresponding to said deflection pattern,
   (d) thereafter removing non-exposed areas of said layer by developing said ion-sensitive resist, and
   (e) using said ion exposed area overlying said region as a mask during subsequent processing.

2. A method according to claim 1, wherein said beam of ions includes ions of a dopant of one conductivity type, said region being formed of said one conductivity type, and wherein said mask formed by said ion exposed area of said layer as provided in step (c) at least partly defines a lateral extent of another region of opposite conductivity type, said another region of opposite conductivity type being formed in said semiconductor body adjacent said region of said one conductivity type at a different time than said region of one conductivity type.

3. A method according to claims 1 or 2, wherein said beam of ions is deflected in an annular or a grid-like pattern across said major surface.

4. A method of manufacturing a semiconductor device comprising the steps of
   (a) providing a semiconductor body,
   (b) providing an ion sensitive resist layer on a major surface of said semiconductor body,
   (c) implanting a beam of ions into a region of said semiconductor body through said layer of ion sensitive resist, said step of implanting being carried out by deflecting said beam across said major surface of said semiconductor body in a pattern corresponding to a deflection pattern, said beam of ions being of sufficient energy to be implanted into said semiconductor body,
   wherein said implanting step further exposes at least a portion of said layer to said beam of ions at an area overlying said region simultaneously with said step of implanting into said region to thereby sensitize said portion of said layer in said pattern corresponding to a deflection pattern,
   (d) thereafter removing non-exposed areas of said layer by developing said ion-sensitive resist, and
   (e) using said ion exposed area overlying said region as a mask during subsequent processing,
   wherein said beam of ions includes ions of a dopant of one conductivity type, said region being formed of said one conductivity type, and wherein said mask formed by said ion exposed area of said layer as provided in step (c) at least partly defines a lateral extent of another region of opposite conductivity type, said another region of opposite conductivity type being formed in said semiconductor body adjacent said region of said one conductivity type at a different time than said region of one conductivity type,
   wherein an insulating layer is formed between said layer of ion-sensitive resist and said major surface of said semiconductor body, wherein said beam of ions of said one conductivity type also penetrate said insulating layer, and wherein said ion exposed area of said layer is used as said mask during an etching step to remove said insulating layer below said non-exposed areas of said layer, said removed insulating layer creating a window to said semiconductor body, said window being subsequently used to introduce dopant of said opposite conductivity type to form said another region.

5. A method according to claim 4, wherein an integrated circuit of field effect transistors is provided by forming a plurality of said windows through said insulating layer, and by forming a field effect transistor in each of said plurality of said windows, and wherein said region of one conductivity type is sufficiently highly doped to prevent a parasitic channel of said opposite conductivity type below parts of said insulating layer between said plurality of windows.

6. A method according to claim 5, wherein at least one of said field effect transistors has an insulated gate provided locally over a corresponding window before introducing said dopant of said opposite conductivity type, said dopant of said opposite conductivity type forming source and drain regions of said field effect transistor in said semiconductor body, said source and drain regions having lateral extents limited by said ion-exposed area and by said insulated gate.

7. A method according to claim 4, wherein a bipolar transistor is formed by providing an emitter zone in said another region of said opposite conductivity type, and wherein said region of said one conductivity type forms a highly doped base zone laterally surrounding said emitter zone.

8. A method of manufacturing a semiconductor device comprising the steps of
   (a) providing a semiconductor body,
   (b) providing an ion sensitive resist layer on a major surface of said semiconductor body,
   (c) implanting a beam of ions into a region of said semiconductor body through said layer of ion sensitive resist, said step of implanting being carried out by deflecting said beam across said major surface of said semiconductor body in a pattern corresponding to a deflection pattern, said beam of ions being of sufficient energy to be implanted into said semiconductor body,
   wherein said implanting step further exposes at least a portion of said layer to said beam of ions at an area overlying said region simultaneously with said step of implanting into said region to thereby sensitize said portion of said layer in said pattern corresponding to a deflection pattern,
   (d) thereafter removing non-exposed areas of said layer by developing said ion-sensitive resist, and
   (e) using said ion exposed area overlying said region as a mask during subsequent processing,
   wherein said beam of ions includes ions of a dopant of one conductivity type, said region being formed of said one conductivity type, and wherein said mask formed by said ion exposed area of said layer as provided in step (c) at least partly defines a lateral extent of another region of opposite conductivity type, said another region of opposite conductivity type being formed in said semiconductor body adjacent said region of said one conductivity type at a different time than said region of one conductivity type,
   wherein a bipolar transistor is formed by providing an emitter zone in said another region of said opposite conductivity type, and wherein said region of said one conductivity type forms a highly doped base zone laterally surrounding said emitter zone.

* * * * *